United States Patent
Liu et al.

(10) Patent No.: US 6,686,785 B2
(45) Date of Patent: Feb. 3, 2004

(54) DESKEWING GLOBAL CLOCK SKEW USING LOCALIZED DLLS

(75) Inventors: Dean Liu, Sunnyvale, CA (US); Tyler J. Thorp, Sunnyvale, CA (US); Pradeep R. Trivedi, Sunnyvale, CA (US); Gin S. Yee, Sunnyvale, CA (US); Claude R. Gauthier, Fremont, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/975,359

(22) Filed: Oct. 11, 2001

(65) Prior Publication Data

US 2003/0071669 A1 Apr. 17, 2003

(51) Int. Cl.$^7$ .................................. H03L 7/06
(52) U.S. Cl. ........................ 327/158; 327/161
(58) Field of Search ................ 327/156, 158, 327/159, 161–163

(56) References Cited

U.S. PATENT DOCUMENTS

| | | | | |
|---|---|---|---|---|
| 6,125,157 A | * | 9/2000 | Donnely et al. | 327/158 |
| 6,140,854 A | * | 10/2000 | Coddington et al. | 327/158 |
| 6,236,695 B1 | * | 5/2001 | Taylor | 327/158 |
| 6,330,197 B1 | * | 12/2001 | Currin et al. | 327/158 |
| 6,346,838 B1 | * | 2/2002 | Hwang et al. | 327/158 |

OTHER PUBLICATIONS

"Clock Generation and Distribution for the First IA–64 Microprocessor," by Simon Tam, Stefan Rusu, Utpal Nagarji Desai, Robert Kim, Ji Zhang and Ian Young, IEEE Journal of Solid–State Circuits, vol. 35., No. 11, Nov. 2000 (8 pages).

"An Adaptive Digital Deskewing Circuit for Clock Distribution Networks," by G. Geannopoulos, and X. Dai, IEEE Journal of Solid–State Circuits, 1998 (7 pages).

Clock Generation and Distribution for the First IA–64 Microprocessor Authors: Simon Tam et al., as published in the IEEE Journal of Solid–State Circuits, vol. 35, No. 11, Nov. 11, 2000, pp. 1545 through 1552.

Clocking Design and Analysis for a 600–MHz Alpha Microprocessor Authors: Daniel W. Bailey and Bradley J. Benschneider as published in the IEEE Journal of Solid–State Circuits, vol. 33, No. 11 Nov., 1998, pp. 1627 through 1633.

Active GHz Clock Network Using Distributed PLLs Authors: Vadim Gutnik and Anatha P. Chandrakasan as published in IEEE Journal of Solid State Circuits, vol. 35, No. 11 Nov., 2000, pp. 1553 through 1560.

A Clock Distribution Network for Microprocessors Authors: Phillip J. Restle et al. as published in IEEE Journal of Solid–State Circuits vol. 36, No. 5, May, 2001 pp. 791 through 799.

* cited by examiner

Primary Examiner—Kenneth B. Wells
(74) Attorney, Agent, or Firm—Rosenthal & Osha L.L.P.

(57) ABSTRACT

An integrated circuit has a plurality of sections, each having a phase detector and a control delay circuit. The phase detector, in response to a phase difference between a reference clock signal and a feedback signal from a portion of a clock grid, controls the delay of its associated clock delay circuit, which, in turn, outputs to the portion of the clock grid. The feedback signal to the phase detector may be connected to an output of a DLL or another portion of the clock grid controlled by a clock delay circuit not associated with the phase detector. Such an arrangement on the integrated circuit leads to clock grid skew reduction.

12 Claims, 5 Drawing Sheets

DESKEWING GLOBAL CLOCK SKEW USING LOCALIZED DLLS

BACKGROUND OF INVENTION

A typical computer system includes at least a microprocessor and some form of memory. The microprocessor has, among other components, arithmetic, logic, and control circuitry that interpret and execute instructions necessary for the operation and use of the computer system. FIG. 1 shows a typical computer system (10) having a microprocessor (12), memory (14), integrated circuits (16) that have various functionalities, and communication paths (18), i.e., buses and wires, that are necessary for the transfer of data among the aforementioned components of the computer system (10).

The components of a computer system use a reference of time to perform the various operations of the computer system. This reference of time is provided to the components of the computer system using one or more clock signals. The components use the one or more clock signals to determine when to conduct certain operations. As computer systems continue to operate at ever-increasing frequencies, it becomes more and more important to ensure that the components of a computer system receive their clock signals in an accurate and timely manner because a mistiming has the potential to cause an error, performance setback, or an outright malfunction of the computer system.

FIG. 2 shows a clock distribution network (20) for a microprocessor (12). A reference clock (also known in the art as "system clock" and shown in FIG. 2 as REF_CLK), which is typically generated from outside the microprocessor (12), serves as an input to a phase locked loop ("PLL") (15). Essentially, the PLL (15) uses feedback to maintain a specific phase relationship between its output (shown in FIG. 2 as CHIP_CLK) and the reference signal. The chip clock from the PLL (15) is then distributed to one or more clock drivers/buffers (17), which, in turn, distribute the chip clock to a global clock grid (19), where the global clock grid (19) feeds the chip clock to various microprocessor components such as local clock grids (24) and a feedback loop (26) that feeds the chip clock back to the PLL (14). The local clock grids (24) feed the chip clock to base components of the microprocessor (12), such as latches (22) and flip-flops (28).

As a clock signal, such as the chip clock shown in FIG. 2, is propagated to the various parts and components of a microprocessor, one or more types of system variations may alter the behavior and/or integrity of the clock signal. Common system variations include, but are not limited to, power variations, temperature variations, and process variations. Due to these and other variations across a microprocessor, a particular clock signal may arrive at different parts of the microprocessor at different times. This difference in the arrival of a clock signal at different system components is referred to and known in the art as "clock skew."

As partly discussed above, clock skew is a function of architectural factors such as load, device distribution across a microprocessor, device mismatch, and temperature and voltage gradients across the microprocessor. By designing a microprocessor that accounts for some of these variations, the amount of clock skew in the microprocessor may be reduced. The process of removing or decreasing clock skew is referred to and known in the art as "deskewing."

Clock deskewing is typically performed in an upper distribution layer of a clock distribution network. For example, in a clock distribution network that has a global and a local layer, deskewing is performed in the global layer. Similarly, in a network that has a global, a regional, and a local layer, deskewing is performed in the global and/or regional layers.

FIG. 3 shows a typical clock distribution network (40) having a global distribution layer (42), a regional distribution layer (44), a local distribution layer (46), where clock deskewing occurs in the regional distribution layer (44). In FIG. 3, a PLL (48) distributes a chip clock to a set of one or more clock drivers/buffers (50), which, in turn output the chip clock to a set of deskewing buffers (52) in the regional distribution layer (44). The deskewing buffers (52) deskew the chip clock and then distribute the deskewed chip clock to a global clock grid (54), which is connected to one or more local clock grids (58), where the local clock grids (58) are connected to microprocessor components such as latches (56), flip-flops (60), and other types of circuit elements (not shown).

A deskewing buffers, as shown in FIG. 3 are typically implemented as a delay locked loop (DLL). A DLL is a component that uses a control signal to maintain an output signal in a specific delay relationship with an input signal. The control signal indicates to the DLL how much delay, if any, the DLL needs to insert into the output signal. Because the amount of delay a DLL inserts is typically not a constant or predefined value, the DLL is known as a "variable delay circuit."

As shown in FIG. 3, when deskewing buffers are included in the regional distribution layer of a clock distribution network, adjusting global clock skew is a less onerous task. However, such deskewing does not account for clock skew contributed by devices and variations in the local distribution layer (such clock skew is referred to and known in the art as "localized clock skew").

SUMMARY OF INVENTION

According to one aspect of the present invention, an integrated circuit comprise: a delay locked loop; a clock delay circuit comprising at least one tunable buffer arranged to output a clock signal to a portion of a clock grid disposed on the integrated circuit; a first phase detector associated with the clock delay circuit and arranged to input a reference clock signal and a feedback signal from the portion of the clock grid, where the first phase detector is arranged to output a signal to the clock delay circuit dependent on a phase difference between the reference clock signal and the feedback signal, and where the reference clock signal is connected to one of an output of the delay looked loop and another portion of the clock grid; and a second phase detector not associated with the clock delay circuit and having a reference clock signal input operatively connected to the portion of the clock grid.

According to another aspect, a method for decreasing clock skew comprises: comparing a phase difference between a reference clock signal and a feedback signal; responsive to the phase difference between the reference clock signal and the feedback signal, adjusting a delay of a first clock delay circuit operatively connected to a portion of a clock grid, where the feedback signal is operatively connected to the portion of the clock grid; comparing a nhase difference between the feedback signal and another feedback signal, where the another feedback signal is operatively connected to another portion of the clock arid: and responsive to the phase difference between the feedback signal and the another feedback signal, adjusting a delay of a second clock delay circuit operatively connected to the another portion of the clock grid.

According to another aspect, an integrated circuit comprises: means for comparing a phase difference between a reference clock signal and a feedback signal; means for adjusting a delay of a first clock delay circuit operatively connected to a portion of a clock grid dependent on the means for comparing the phase difference between the reference clock signal and the feedback signal, where the feedback signal is operatively connected to the portion of the clock grid; means for comparing a phase difference between the feedback signal and another feedback signal, where the another feedback signal is operatively connected to another portion of the clock mid: and means for adjusting a delay of a second clock delay circuit operatively connected to the another portion of the clock grid dependent on the means for comparing the phase difference between the feedback signal and the another feedback signal.

Other aspects and advantages of the invention will be apparent from the following description and the appended claims.

BRIEF DESCRIPTION OF DRAWINGS

FIG. 4b shows a component layout in accordance with the embodiment shown in FIG. 4a.

DETAILED DESCRIPTION

Embodiments of the present invention relate to a method for reducing global clock skew in an integrated circuit. Embodiments of the present invention further relate to a circuit device implementation that reduces global clock skew. Embodiments of the present invention further relate to a technique for increasing computer system performance by reducing system uncertainties associated with clock skew in the computer system.

Particularly, the present invention relates a technique for referencing a point on a clock grid for which to align other points on the clock grid by varying one or more delays of clock buffers associated with the clock grid. This technique helps decrease clock skew by reducing systematic components of clock skew in an integrated circuit.

Figure 1:
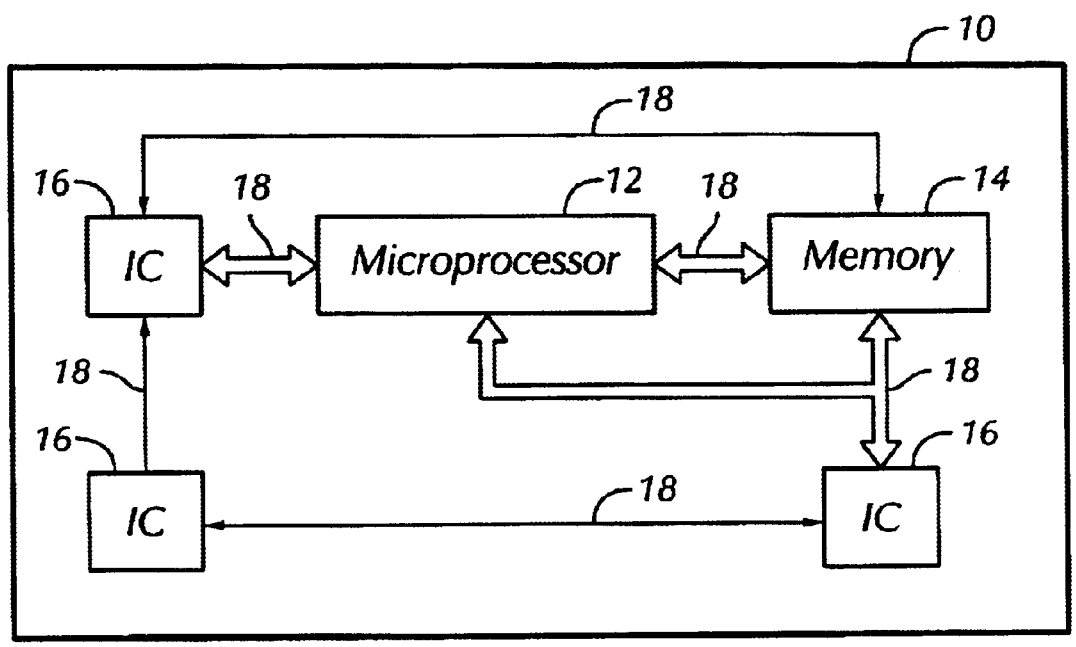
FIG. 1 shows a typical computer system.
Figure 2:
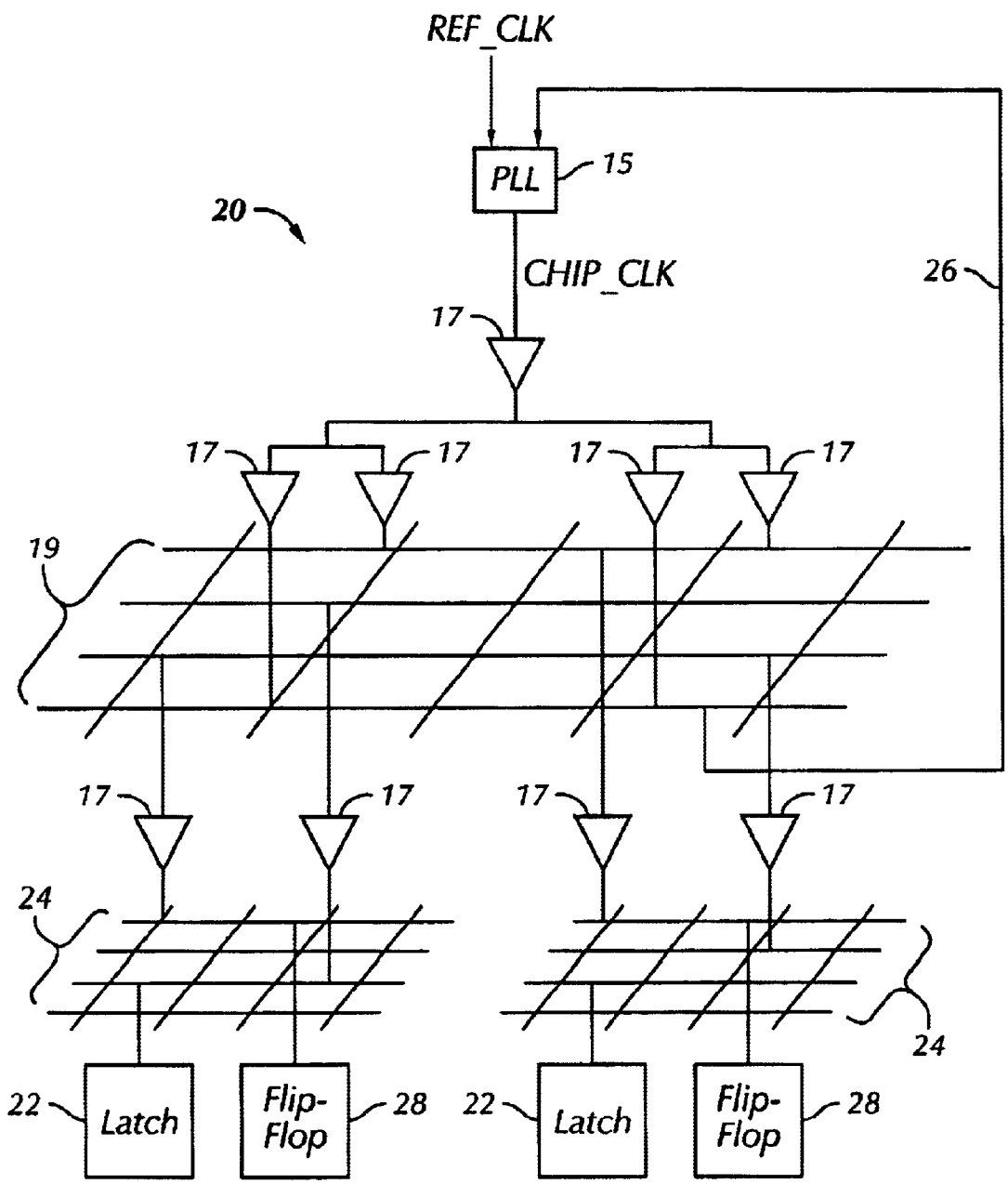
FIG. 2 shows a typical clock distribution network.
Figure 3:
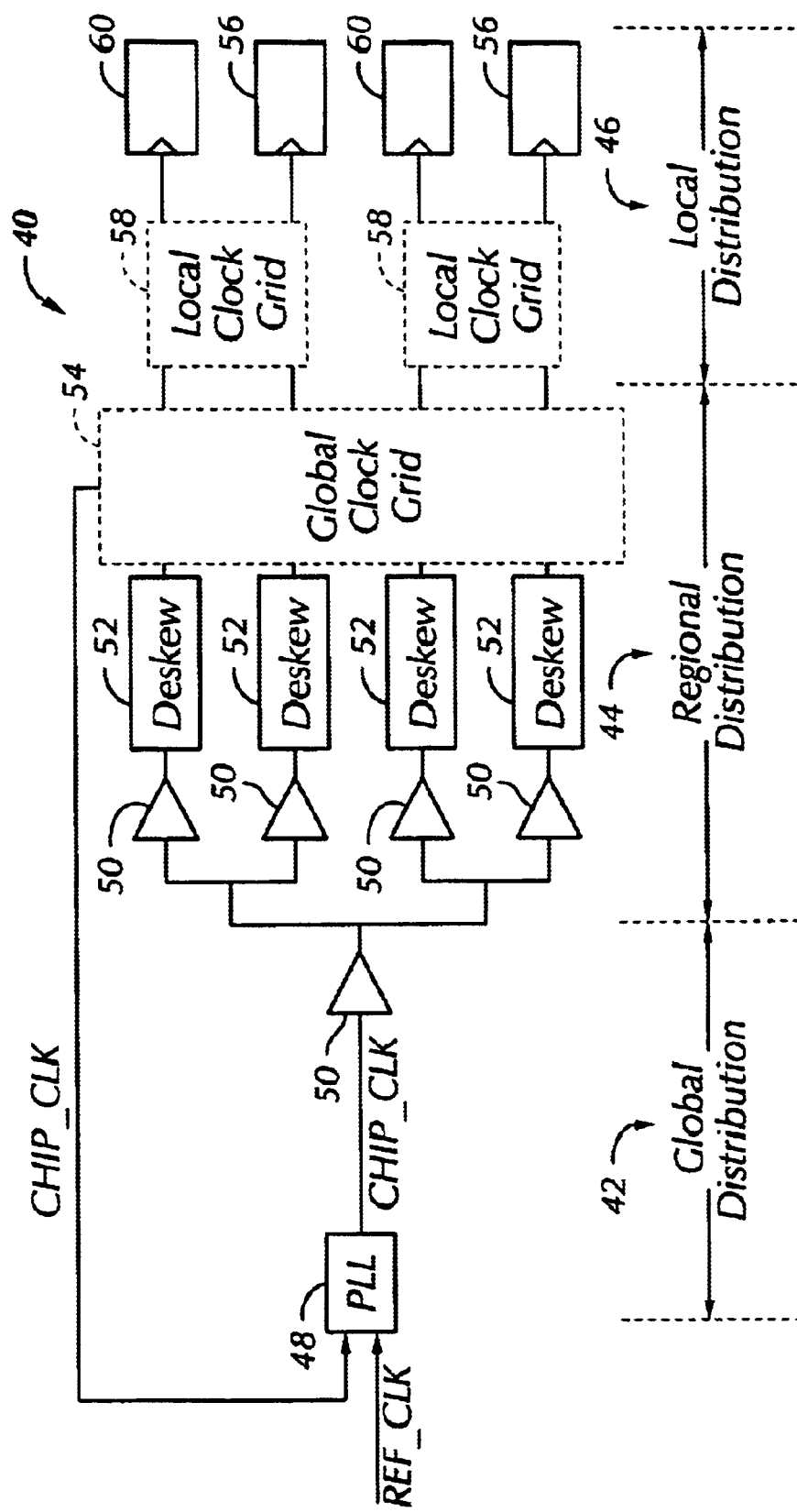
FIG. 3 shows a typical clock distribution network.
Figure 4A:
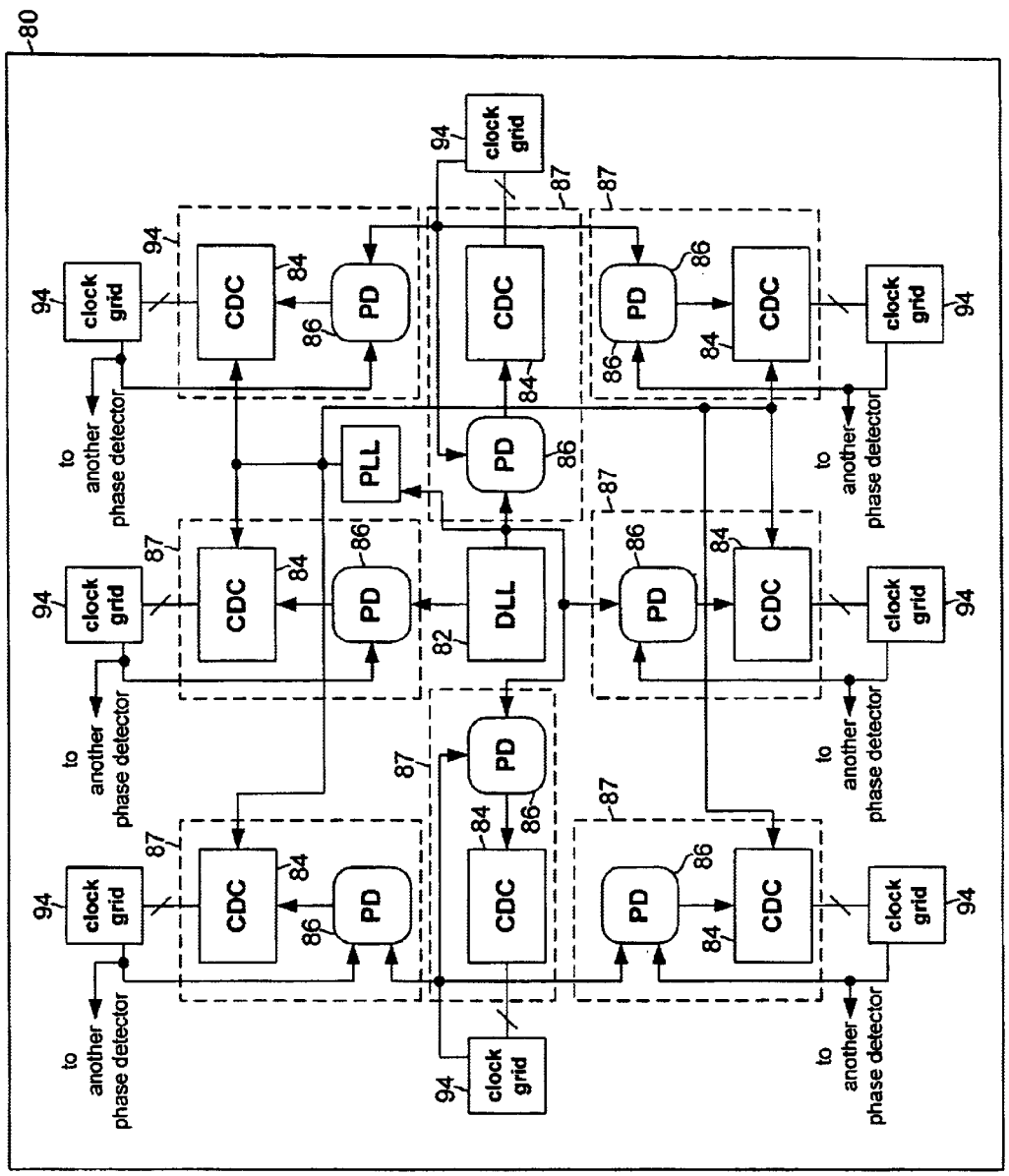
FIG. 4a shows a component layout in accordance with an embodiment of the present invention.

FIG. 4a shows an exemplary component layout of an integrated circuit (80) in accordance with an embodiment of the present invention. In FIG. 4a, a plurality of sections (87) of the integrated circuit (80) each have a phase detector (86) (shown in FIG. 4a as PD) and a clock delay circuit (84) (shown in FIG. 4a as CDC). A phase detector (86) and a clock delay circuit (84) in the same section (87) are said to be "associated." Each phase detector (86) inputs a reference clock signal and a feedback signal from a portion of a clock grid (94) controlled by the clock delay circuit (84) associated with the phase detector (86). Dependent on a phase difference between the reference clock signal and the feedback signal, the phase detector (86) outputs a signal to its associated clock delay circuit (84) indicating whether to speed up or slow down the portion of the clock arid (94) connected to the associated clock delay circuit (84). The reference clock signal input to a particular phase detector (86) may be connected to an output of the DLL (82) or to another portion of clock grid (94) that is controlled by a clock delay circuit (84) not associated with the particular phase detector (86).

Figure 4B:
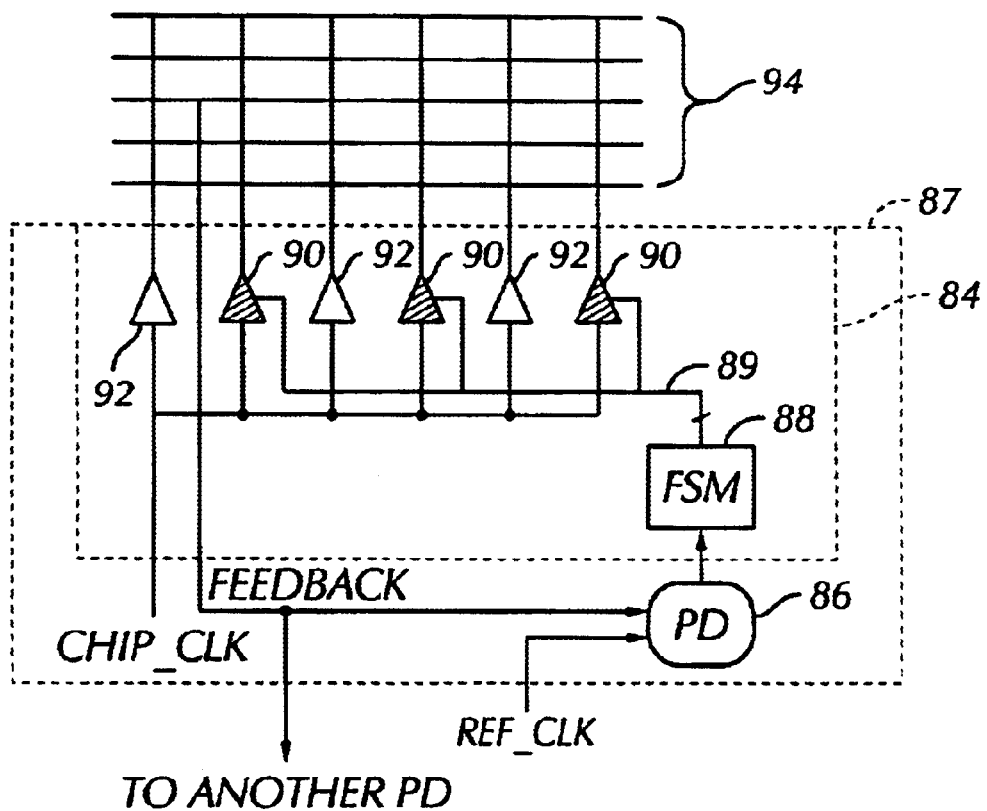

FIG. 4b shows a detailed structure of a section (87) of the integrated circuit (80) in accordance with the embodiment shown in FIG. 4a. The phase detector (86) receives both a reference clock (shown in FIG. 4b as REF_CLK) and a feedback clock (shown in FIG. 4b as FEEDBACK). As shown in FIG. 4b, the feedback signal to the phase detector (86) comes from a portion of the clock arid (94) controlled by the clock delay circuit (84) associated with the phase detector (86). The phase detector (86) determines whether a time phase of the feedback clock is aligned with the time phase of the reference clock. When the time phases of the feedback clock and the reference clock are not aligned, the phase detector (86) indicates as such on an up/down signal (shown in FIG. 4b as UP/DOWN) to a finite state machine (88) (shown in FIG. 4b as FSM) inside the clock delay circuit (84). The up/down signal generated by the phase detector (86) indicates whether the feedback clock needs to be sped up (by an "up" indication) or whether the feedback clock needs to be slowed down (by a "down" indication). Those skilled in the art will appreciate tat the reference clock and feedback clock into the phase detector (86) may be implemented in one or more metal layers of an integrated circuit in order to decrease the effect of transistor and voltage variations.

The finite state machine (88) uses a counter function that counts the number of times the up/down signal is up and the number of times the up/down signal is down. Using these counts, the finite state machine (88) generates control bits to a multi-bit control bus (89) that is used to module the delay of one or more tunable buffers (90).

The tunable buffers (90) in the clock delay circuit (84) are essentially delay elements that are replicated and distributed across a global clock grid (94). The adjustable buffers (90) are interleaved between regular global clock grid buffers (92). With a proper control setting into the tunable buffers (90), the delay of the global clock grid (94) may be modulated. For example, as a default control setting, a tunable buffer (90) has the same drive strength as a regular global clock grid buffer (92). As the control changes, the resulting delay of the tunable buffers (90) is interpolated with that of the regular global clock grid buffers (92) over the global clock grid (94), thereby changing an overall delay of the global clock grid (94).

Figure 5:
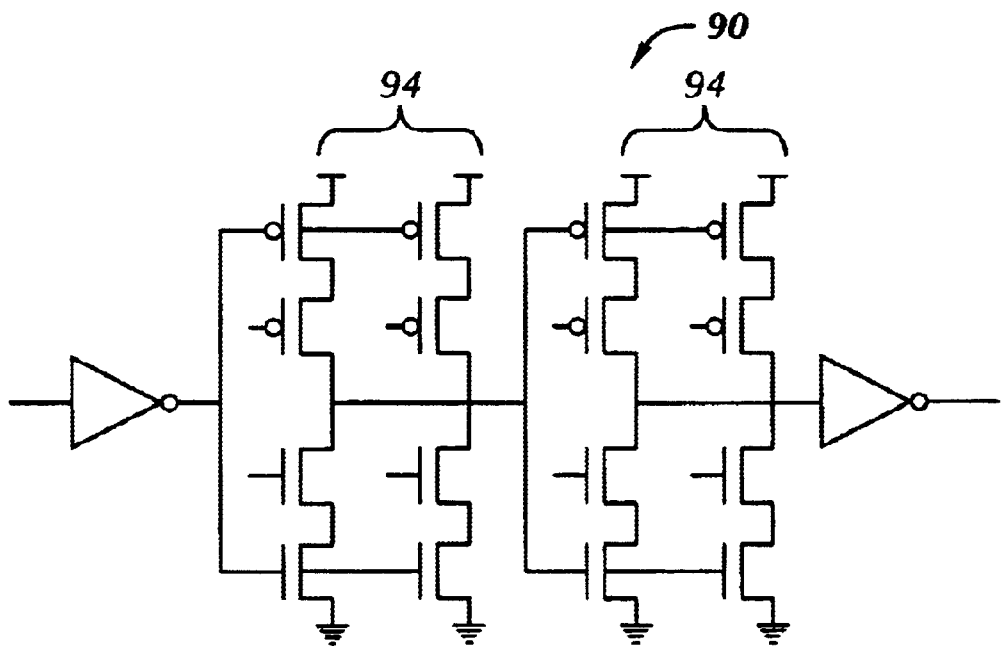
FIG. 5 shows a design in accordance with an embodiment of the present invention.

FIG. 5 shows an exemplary design of a tunable buffer (90) in accordance with an embodiment of the present invention. The tunable buffer (90) is implemented using parallel transistor stacks (94). The gate of each transistor in a transistor stack in is connected to a particular control bit on the control bus (89). When a control bit is asserted, the corresponding transistor stack contributes to an output current of the tunable buffer (90), thereby increasing the tunable buffer's drive strength. Conversely, when the control bit is deasserted, the corresponding transistor stack is tri-stated, thereby reducing the tunable buffer's drive strength.

Those skilled in the art will appreciate that the number of control bits used to control a particular tunable buffer may be adjusted depending on the amount of skew that one wishes to adjust for and/or the amount of delay resolution one wishes to observe or have. It follows that using more control bits allows for a larger range of compensation and finer time step. Further, those skilled in the art will appreciate that the number of transistor stacks used in a tunable buffer may also be changed according to the amount of control bits one wishes to use.

Advantages of the present invention may include one or more of the following. In some embodiments, because a point on a clock grid is referenced to align other points on the clock grid to, clock skew is reduced.

In some embodiments, because localized clock delay circuits are used to reduce global clock skew, clock skew introduced at the local distribution layer may be reduced.

In some embodiments, because clock skew is decreased by using localized clock delay circuits having tunable buffers that are connected to a global clock grid, a skew budget for a clock distribution network may be decreased.

In some embodiments, because clock skew is reduced, system performance is increased.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit, comprising:
   a delay locked loop;
   a clock delay circuit comprising at least one unable buffer arranged to output a clock signal to a portion of a clock grid disposed on the integrated circuit;
   a first phase detector associated with the clock delay circuit and arranged to input a reference clock signal and a feedback signal from the portion of the clock grid, wherein the first phase detector is arranged to output a signal to the clock delay circuit dependent on a phase difference between the reference clock signal and the feedback signal, and wherein the reference clock signal is connected to one of an output of the delay locked loop and another portion of the clock grid; and
   a second phase detector not associated with the clock delay circuit and having a reference clock signal input operatively connected to the portion of the clock grid.

2. The integrated circuit of claim 1, wherein the delay locked loop outputs to a phase locked loop.

3. The integrated circuit of claim 1, wherein the tunable buffer is interleaved between a clock grid buffer and at least one other clock grid buffer.

4. The integrated circuit of claim 1, wherein the clock delay circuit is disposed at a first location on the integrated circuit different from a second location where the delay locked loop is disposed, and wherein the clock delay circuit aligns a signal at the first location with a signal at the second location by varying a delay of the tunable buffer.

5. The integrated circuit of claim 1, wherein the clock delay circuit comprises a finite state machine that inputs a signal from the first phase detector and outputs at least one control bit to the tunable buffer dependent on the signal from the first phase detector.

6. The integrated circuit of claim 5, wherein an output from the finite state machine is connected to a control bus.

7. The integrated circuit of claim 6, wherein the tunable buffer comprises:
   a transistor stack, wherein the transistor stack contributes current to an output of the tunable buffer dependent on the control bus.

8. The integrated circuit of claim 6, wherein the transistor stack decreases current to an output of the tunable buffer dependent on the control bus.

9. The integrated circuit of claim 7, wherein the transistor stack comprises a transistor having an input operatively connected to a control bit on the control bus.

10. A method for decreasing clock skew, comprising:
    comparing a phase difference between a reference clock signal and a feedback signal;
    responsive to the phase difference between the reference clock signal and the feedback signal, adjusting a delay of a first clock delay circuit operatively connected to a portion of a clock grid, wherein the feedback signal is operatively connected to the portion of the clock grid;
    comparing a phase difference between the feedback signal and another feedback signal, wherein the another feedback signal is operatively connected to another portion of the clock grid; and
    responsive to the phase difference between the feedback signal and the another feedback signal, adjusting a delay of a second clock delay circuit operatively connected to the another portion of the clock grid.

11. The method of claim 10, further comprising:
    generating pulses on an up/down signal to a finite state machine dependent on the phase difference between the reference clock signal and the feedback signal;
    generating at least one control bit to a buffer in the first clock delay circuit in response to generating pulses on the up/down signal; and
    driving a signal on the portion of the clock grid based on the at least one control bit.

12. An integrated circuit, comprising:
    means for comparing a phase difference between a reference clock signal and a feedback signal;
    means for adjusting a delay of a first clock delay circuit operatively connected to a portion of a clock grid dependent on the means for comparing the phase difference between the reference clock signal and the feedback signal, wherein the feedback signal is operatively connected to the portion of the clock grid;
    means for comparing a phase difference between the feedback signal and another feedback signal, wherein the another feedback signal is operatively connected to another portion of the clock grid; and
    means for adjusting a delay of a second clock delay circuit operatively connected to the another portion of the clock grid dependent on the means for comparing the phase difference between the feedback signal and the another feedback signal.

* * * * *